(12) United States Patent
Liu et al.

(10) Patent No.: US 8,679,367 B2
(45) Date of Patent: Mar. 25, 2014

(54) GREEN-EMITTING (OXY)NITRIDE-BASED PHOSPHORS AND LIGHT-EMITTING DEVICE USING THE SAME

(71) Applicant: Intematix Corporation, Fremont, CA (US)

(72) Inventors: Shengfeng Liu, Newark, CA (US); Dejie Tao, Fremont, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

(21) Appl. No.: 13/633,861

(22) Filed: Oct. 2, 2012

(65) Prior Publication Data

US 2014/0042365 A1    Feb. 13, 2014

Related U.S. Application Data

(60) Provisional application No. 61/700,257, filed on Sep. 12, 2012, provisional application No. 61/681,569, filed on Aug. 9, 2012.

(51) Int. Cl.
*C09K 11/08* (2006.01)
*C09K 11/66* (2006.01)
*H01J 1/62* (2006.01)
*H01J 63/04* (2006.01)

(52) U.S. Cl.
USPC .................................... 252/301.4 F; 313/503

(58) Field of Classification Search
USPC ....... 252/301.4 R, 301.6 R, 301.4 F; 313/503
See application file for complete search history.

(56) References Cited

U.S. PATENT DOCUMENTS 7,476,335 B2 *   1/2009   Sakane et al. ........... 252/301.4 F
7,524,437 B2 *   4/2009   Sakane et al. ........... 252/301.4 F
(Continued)

FOREIGN PATENT DOCUMENTS

KR          10-0891554          4/2009
KR       10-2011-0007482        1/2011
KR       10-2012-0038036        4/2012

OTHER PUBLICATIONS

Choi. Green-emitting Yb2+-doped alpha-sialon phosphors prepared by spark plasma sintering. Optical Materials 33 (available online Jun. 8, 2011) 1700-1703.*

(Continued)

*Primary Examiner* — Carol M Koslow
*Assistant Examiner* — Matthew E Hoban
(74) *Attorney, Agent, or Firm* — David H. Jaffer; Pillsbury Winthrop Shaw Pittman LLP (57) ABSTRACT

A green-emitting phosphor having the formula $A_aB_bC_cO_dN_e$:RE, wherein A is a positively charged divalent element; B is a positively charged trivalent element; C is a positively charged tetravalent element; and RE is a rare earth activator. The parameter a ranges from about 0.5 to about 1.5; the parameter b ranges from about 0.8 to about 3.0; the parameter c ranges from about 3.5 to about 7.0; the parameter d ranges from about 0.1 to about 3.0; and the parameter e ranges from about 5.0 to about 11.0. A is at least one of Mg, Ca, Sr, Ba, and Zn; B (the letter) is at least one of B (boron), Al, Ga, and In; C (the letter) is at least one of C (carbon), Si, Ge, and Sn; O is oxygen; N is nitrogen; and RE is at least one of Eu, Ce, Pr, Tb, and Mn.

29 Claims, 10 Drawing Sheets

(56) References Cited

U.S. PATENT DOCUMENTS

| | | | |
|---|---|---|---|
| 7,887,718 B2* | 2/2011 | Nagatomi et al. | 252/301.4 F |
| 8,062,549 B2 | 11/2011 | Nagatomi et al. | |
| 8,153,025 B2 | 4/2012 | Schmidt et al. | |
| 8,372,309 B2* | 2/2013 | Nagatomi et al. | 252/301.4 F |
| 8,450,923 B2* | 5/2013 | Fukuda et al. | 313/503 |
| 8,475,680 B2* | 7/2013 | Fukuda et al. | 252/301.4 F |
| 8,475,682 B2* | 7/2013 | Nagatomi et al. | 252/301.4 F |
| 8,482,192 B2* | 7/2013 | Fukuda et al. | 313/503 |
| 8,491,817 B2* | 7/2013 | Fukuda et al. | 252/301.4 F |
| 2008/0035888 A1 | 2/2008 | Ceintrey et al. | |
| 2010/0244076 A1* | 9/2010 | Schmidt et al. | 257/98 |
| 2011/0204769 A1* | 8/2011 | Fukuda et al. | 313/503 |

OTHER PUBLICATIONS

Ruan, J., et al. "Nitrogen gas pressure synthesis and photoluminescent properties of orange-red $SrAlSi_4N_7:Eu^{2+}$ phosphors for white light-emitting diodes," *J. Am. Ceram. Soc.*, 94 [2] 536-542 (2011).

Hecht, C., et al., "$SrAlSi_4N_7:Eu^{2+}$—A nitridoalumosilicate phosphor for warm white light (pc)LEDs with edge-sharing tetrahedral," Chem. Mater. 2009, 21, 1595-1601.

*International Tables for Crystallography*, vol. A, Space-Group Symmetry, edited by T. Hahn, second, revised edition (International Union of Crystallography, Boston, 1987), pp. 224-225.

* cited by examiner

GREEN-EMITTING (OXY)NITRIDE-BASED PHOSPHORS AND LIGHT-EMITTING DEVICE USING THE SAME

CROSS-REFERENCE TO RELATED APPLICATIONS

This application claims the benefit of U.S. Provisional Application No. 61/681,569, filed Aug. 9, 2012 and U.S. Provisional Application No. 61/700,257, filed Sep. 12, 2012, both incorporated herein by reference in their entirety.

BACKGROUND OF THE INVENTION

1. Field of the Invention

Embodiments of the present invention are directed to (oxy)nitride-based phosphor compositions that may be excited by radiation ranging from the UV to the blue region of the electromagnetic spectrum, and under such excitation, emit in the green region. The field of the invention includes considerations of the structure of such phosphors, the methods of their synthesis, and related white light-emitting devices.

2. Description of the Related Art

Certain nitride and (oxy)nitride-based phosphors are known in the art. In general, they fall into one of two different types or classes of compounds; both are nitrides, but only one contains oxygen. For convenience, the nomenclature of these nitride/oxynitride-based phosphors may be abbreviated to (oxy)nitride-based, and the terms "nitride/oxynitride" and "(oxy)nitride" will be considered to be equivalent in this disclosure.

One such nitride relevant to the present disclosure is based on a host having the formula $SrAlSi_4N_7$. This compound is known to emit in the orange-to-red region of the electromagnetic spectrum when activated by the divalent rare earth $Eu^{2+}$. It has been discussed at length in the literature, in one such paper by Hecht et al., as well one by Ruan et al. The relevance of this discussion will become apparent in a later section, where modifications to the $SrAlSi_4N_7$ host crystal structure are discussed in the context of the present embodiments.

In one embodiment of the present invention, the green-emitting, (oxy)nitride-based phosphors are derived from $\alpha$-$Si_3N_4$, rather than from $\beta$-$Si_3N_4$, is the case with the conventionally known, green-emitting $\beta$-SiAlON. The present green-emitting (oxy)nitride based phosphors are configured to emit radiation having a wavelength ranging from about 500 to about 550 nm when excited by blue or UV light (e.g., radiation ranging from about 200 nm to about 470 nm), and differ from the $\beta$-SiAlONs in structure. Two papers from the literature have described the prior art phosphor $SrAlSi_4N_7$. These papers will be briefly reviewed.

Hecht et al.

A description of one such nitride-based phosphor was provided by C. Hecht et al. in an article titled "$SrAlSi_4N_7$:$Eu^{2+}$—A nitridoalumosilicate phosphor for warm shite light (pc)LEDs with edge-sharing tetrahedral," Chem. Mater. 2009, 1, 1595-1601. This phosphor emits in the red, and thus its use allows a white light illumination product to be "warm," with high color rendering. Structure-wise, the compound features infinite chains of edge-sharing $AlN_4$ tetrahedra."

Hecht et al. teach that $SrAlSi_4N_7$:$Eu^{2+}$ may be synthesized from the starting materials Sr metal, $\alpha$-$Si_3N_4$, AlN, and Eu metal. The raw powders were sintered in a nitrogen atmosphere at temperatures up to 1630° C. to produce a crystalline substance in the orthorhombic crystal system with the space group Pna$2_1$ (No. 33). The lattice parameters are a=11.7 Å, b=21.39 Å, and c=4.97 Å. The $Eu^{2+}$ doped compound $SrAlSi_4N_7$ exhibits the emission $4f^65d^1 \rightarrow 4f^7$ in the orange-red region of the spectrum (for 2% Eu doping and 450 nm excitation, $\lambda_{max}$=632 nm). The network structure of this compound, was characterized by corner-sharing $SiN_4$ tetrahedra incorporating infinite chains of edge-sharing $AlN_4$ tetrahedra, whose direction runs parallel to the [001] direction (i.e., the c-axis).

The manner in which the tetrahedra are linked has other implications. As taught by Hecht et al. in Chem. Mater. 2009, 1, 1595-1601, the tetrahedra in $SrAlSi_4N_7$ are linked not only by "linked common corners," where the vertices of two adjacent tetrahedra are shared; there are also configurations where two adjacent tetrahedra are joined by a common edge. Contained within the $SrAlSi_4N_7$ structure are infinite chains of trans-edge-sharing tetrahedra that run along the [001] direction of the crystal (in other words, parallel to the c-axis). Hecht et al. suggest that the cations occupying each of the edge-shared tetrahedra in the infinite chains are trivalent aluminum cations, $Al^{3+}$. The trans-edge-shared $AlN_4$ tetrahedra in the infinite chains are cross-linked via corner-shared $SiN_4$ tetrahedra. This leads to channels along the c direction where the modifying cations, in this case the divalent alkaline earth elements such as Sr, are inserted. The channels host two different types of alkaline earth (Sr) positions that are coordinated by irregular polyhedral consisting of either six or eight nitrogen atoms.

The diagram for space group is Pna$2_1$ (No. 33) in *International Tables For Crystallography*, Volume A, Space-Group Symmetry, edited by T. Hahn, second, revised edition (International Union of Crystallography, Boston, 1987), pp. 224-225. It indicates that there is only one special site per unit cell; each of the 10 different Si/Al sites in the unit cell of $SrAlSi_4N_7$ resides on a Wyckoff position 4a. Hecht et al. teach that chemical and structural analyses "suggest that two out of these 10 positions should be exclusively occupied by Al [.]. Unlike $Si^{4+}$, aluminum ($Al^{3+}$) seems to be predestined [to be] situated on the tetrahedral centers of the infinite chains [making up the] edge-sharing tetrahedral [$AlN_4$]."

Ruan et al.

Ruan et al. teach, in an article titled "Nitrogen gas pressure synthesis and photoluminescent properties of orange-red $SrAlSi_4N_7$:$Eu^{2+}$ phosphors for white light-emitting diodes," *J. Am. Ceram. Soc.*, 94 [2] 536-542 (2011), that the enhanced mechanical properties of nitride-based phosphors are explained, in large part, by the stiff frameworks provided by a highly condensed network of corner and edge-shared $SiN_4$ and $AlN_4$ tetrahedra. Such compounds exhibit enhanced optical properties as well: rare earth doped (oxy)nitride phosphors have excitation bands covered by the emission of commercially available InGaN-based LED chips "because of the strong nephelauxetic effect and large crystal field splitting caused by the [higher] coordination of the nitrogen [anions relative to the O anions of an oxide-based phosphor]."

Ruan et al. reviewed the work of Hecht et al. (discussed above), and state in view of the latter's disclosure: "It is obvious that there are two different Sr lattice sites in $SrAlSi_4N_7$." It appears that they do not sit on the corners of an orthorhombic unit cell (the crystal system of the recently disclosed orange-red $SrAlSi_4N_7$:$Eu^{2+}$ phosphors). More precisely, there are two Sr (modifier cation) interstitial sites per unit cell, and they differ in size and coordination number. The Ruan et al. article is relevant to the present disclosure in that it discusses the difficulties encountered with the synthesis of the title compounds.

Ruan et al. make a critical observation about the synthesis of the $SrAlSi_4N_7$: "the reported synthesis of $SrAlSi_4N_7$:$Eu^{2+}$ based on radiofrequency furnace is usually baffled by the byproducts of microcrystalline $Sr_2Si_5N_8$." While not wishing to characterize Ruan et al.'s statement, it is certainly understood as the present inventors have experienced similar "difficulties" with the appearance of undesired phases, particularly $Sr_2Si_5N_8$. While not wishing to be bound by any particular theory, it is believed that the kinetics and/or thermodynamics of the synthesis are such that a $Sr_2Si_5N_8$ phase has, in certain situations, a lower free energy of synthesis than does the desired $SrAlSi_4N_7$, and with this in mind, steps may be taken to modify traditional solid state reaction conditions so as to favor the synthesis of the desired $SrAlSi_4N_7$ compound.

Ruan et al. discuss the structure of a modification. Their synthesis of crystalline $SrAlSi_4N_7$:$Eu^{2+}$ via gas pressure sintering, using starting materials that included $Sr_3N_2$, $\alpha$-$Si_3N_4$, AlN, and EuN. The mixtures were fired at 1750° C. for 2 hours under a 0.48 MPa nitrogen atmosphere in a gas pressure sintering furnace. Subsequently, the samples were mixed with additive AlN "with contents equal to the first time" and refired for 6 hours under the same conditions.

Ruan et al. reported that the pure $SrAlSi_4N_7$ phase was difficult to achieve with the starting raw materials mixed stoichiometrically. See *J. Am. Ceram. Soc.*, 94 [2] (2011), p. 537. They reported that "additional AlN may be helpful to solve the problem." X-ray diffraction (XRD) data of samples taken after the first firing, where starting material ratios were calculated based on the desired stoichiometric composition (e.g., $SrAlSi_4N_4$), and after the second firing, where excess AlN has been added. Ruan et al. showed that their data shows that the primary phase of the product after the first firing was $Sr_2Si_5N_8$, with only a small amount of the desired $SrAlSi_4N_7$ compound being produced. After the second firing, where excess AlN had been added to the mix, the main phase was the desired $SrAlSi_4N_7$ phase, and interestingly, almost no AlN or $Sr_2Si_5N_8$ could be recognized. The authors state that the concentration of AlN is critical to the formation of the $SrAlSi_4N_7$ phase, at least under their reaction conditions, and the broader point may be made that reaction mechanism(s) leading to the formation of the $SrAlSi_4N_7$ phase are not fully understood.

These two research papers reveal that the synthesis and properties of the compound $SrAlSi_4N_7$ are known. They establish a base compound that can be modified.

SUMMARY OF THE INVENTION

The present invention describes (oxy)nitride-based phosphor compositions that may be excited by radiation ranging from the UV to the blue region of the electromagnetic spectrum, and under such excitation, emit in the green region. Some embodiments of these phosphors are based on a critical composition change to the known $SrAlSi_4N_7$ red nitride material, which is the addition of oxygen, charge balanced by increasing the amount of one or more cations and/or adjustment in the amount of nitrogen. In one embodiment Si and Al can be increased independently to compensate for the extra charge due to the addition of oxygen, while the nitrogen content is unchanged. In another embodiment, the additional oxygen charge was balanced by a corresponding decrease of the nitrogen charge, while all of the cations (Sr, Si and Al, for example) are maintained with a stoichiometric ratio of $SrAlSi_4$. In yet another embodiment, the addition of 0.5 moles of oxygen was charge balanced by both additional silicon and nitrogen. In a further embodiment, the addition of 0.5 moles of oxygen was charge balanced by both additional Al and nitrogen.

According to embodiments of the present invention, the present green-emitting phosphors may have, in one embodiment, the formula $A_aB_bC_cO_dN_e$:RE, where A is a positively charged divalent element; B is a positively charged trivalent element; C is a positively charged tetravalent element; and RE is a rare earth activator. When A is an alkaline earth and B is Al, and when C is Si, then the parameter a ranges from about 0.5 to about 1.5, endpoints inclusive. The parameter b may range from about 0.8 to about 3.0, endpoints inclusive; the parameter c may range from about 3.5 to about 7.0; the parameter d may range from about 0.1 to about 3.0; and the parameter e may range from about 5.0 to about 11.0, endpoints inclusive. In one embodiment, A is at least one of Mg, Ca, Sr, Ba, and Zn, either individually or in combinations; B (the letter) is at least one of B (boron), Al, Ga, and In, either individually or in combinations; C (the letter) is at least one of C (carbon), Si, Ge, and Sn; O is oxygen; N is nitrogen; and RE is at least one of Eu, Ce, Pr, Tb, and Mn, either individually or in combinations. In these embodiments (as well as in others), the phosphor(s) are configured to emit green light having a peak emission wavelength ranging from about 500 nm to about 550 nm when excited by radiation ranging from the UV to the blue region of the electromagnetic spectrum.

Embodiments of the present invention may include a green-emitting phosphor having the formula $SrSi_{4+x}Al_{1+y}O_{(2x+3y/2)}N_7$:Eu, where values of x or y are chosen to shift the emission spectrum into the green from the red emitting composition provided by x,y=0. For example, phosphor compositions with x=0, y=0.33 and x=0.25, y=0 are green emitting phosphors.

According to yet further embodiments of the present invention, a phosphor may have the formula $SrSi_4AlO_xN_{7-2x/3}$:Eu, where values of x are chosen to shift the emission spectrum into the green from the red emitting composition provided by x=0. For example, phosphor compositions with x=0.5 and x=0.7 are green emitting phosphors.

According to further embodiments of the present invention, a green-emitting phosphor may have the formula $SrSi_{4+x}AlO_{0.5}N_{7+(4x-1)/3}$:Eu, where x is greater than or equal to 0.

According to yet further embodiments of the present invention, a green-emitting phosphor may have the formula $SrSi_{4.5}Al_{1+y}O_{0.5}N_{y+22/3}$:Eu, where y is greater than or equal to 0.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 9A-C are the results of reliability testing for 1,000 hours under the conditions 85° C. and 85% humidity for the phosphor of Example 1, compared to the commercially available β-SiAlON phosphor.

DETAILED DESCRIPTION OF THE INVENTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

A wide variety of modifications to the $SrAlSi_4N_7$ host crystalline structure are conceivable, at least in a mathematical sense. One subset involves making changes to the content of the existing constituents of $SrAlSi_4N_7$ (Sr, Al, Si, and N), without the addition of any new elements, with the exception of oxygen; oxygen is a new element that is added. A good starting point to discuss possible modifications is the Al for Si substitution, since this exchange was one of the first made for the purpose of altering optical properties of oxygen-containing phosphors based on such nitrides.

In one embodiment of the present invention, the present green-emitting, (oxy)nitride-based phosphors may be represented by the formula $A_aB_bC_cO_dN_e$, where A is a positively charged divalent element; B is a positively charged trivalent element; C is a positively charged tetravalent element, "a" ranges from about 0.5 to about 1.5 when A is an alkaline earth, endpoints inclusive; "b" ranges from about 0.8 to about 3.0, endpoints inclusive; "c" ranges from about 3.5 to about 7.0; "d" ranges from about 0.1 to about 3.0; and e ranges from about 5.0 to about 11.0, endpoints inclusive. In one embodiment, A is at least one of Mg, Ca, Sr, Ba, and Zn, either individually or in combinations. B (the letter) is at least one of B (boron), Al, Ga, and In, either individually or in combinations. C (the letter) is at least one of C (carbon), Si, Ge, and Sn; O is oxygen, and N is nitrogen.

Furthermore, in preferred embodiments, "a" ranges from about 0.7 to about 1.0 when A is an alkaline earth, endpoints inclusive; "b" ranges from about 1.0 to about 1.3, endpoints inclusive; "c" ranges from about 4.0 to about 5.0; "d" ranges from about 0.1 to about 1.0; and e ranges from about 6.0 to about 8.0, endpoints inclusive.

In some embodiments of the present invention, the green-emitting, (oxy)nitride-based phosphors are derived from α-$Si_3N_4$, rather than from β-$Si_3N_4$, as may be the case with the conventionally known, green-emitting β-SiAlON. These (oxy)nitride based phosphors are configured to emit radiation having a peak wavelength ranging from about 500 to about 550 nm when excited by blue light (e.g., radiation ranging from about 420 nm to about 470 nm). They contain additions of elements Al, Si, and O, where it is the addition of oxygen that is believed to be the key in converting a conventional $SrAlSi_4N_7$ phosphor into a green-emitting (oxy-nitride). For example, one embodiment is based on at least one of additional Al and Si to charge balance the additional oxygen, and another embodiment is based on the decreasing of nitrogen to charge balance additional oxygen, or the addition of Al or Si to charge balance the additional oxygen in combination with decreasing or increasing nitrogen, dependent on the total charge difference between additional cations (Al or Si) and oxygen.

Conventional Substitutions of Al for Si (and the Associated Event, O for N)

The silicon nitride structure (whether in the α or β form) is known to consist of $SiN_4$-based tetrahedral structures with silicon cations at their centers, and nitrogen anions at each of the four corners. The tetrahedrons may share corners, and even edges, forming a more condensed, "cross-linked" structure that give the nitrides their mechanical strength and environmental stability (over, for example, analogous oxides). Now, when an $Al^{3+}$ cation replaces an $Si^{4+}$ cation at the center of a tetrahedron, a charge imbalance is created due to the missing positive charge. One way to compensate for this missing positive charge is to generate a corresponding missing negative charge, as would be the case if an $O^{2-}$ anion were to substitute for an $N^{3-}$ anion at one of the tetrahedral corners. As further pairs of substitutions are put into effect, a structure develops that is best described by the nomenclature $(Al,Si)$—$(O,N)_4$, as their representation shows that it is not known precisely which substitutions are taking place in which tetrahedron.

An example of this type of modification to the $SrAlSi_4N_7$ structure is taught by U.S. Pat. No. 8,062,549 to Nagatomi et al., a more or less straightforward exemplification of the Al/Si and O/N substitution model. Nagatomi et al.'s "first phosphor" takes the form $SrAl_{1+x}Si_{4-x}O_xN_{7-x}$. Here, when x=0, and no substitutions have occurred, the formula takes the familiar form $SrAlSi_4N_7$, the compound discussed in the related art section. As an amount "x" of the element Al is added, denoted by the subscript 1+x, the Al replaces Si, and this replacement results in a loss of Si denoted by the subscript 4−x on Si. Charge balance is achieved by adding x amount of O (designated $O_x$), and since the additional O replaces N, the amount of N is decremented by x, as shown by $N_{7-x}$. In this embodiment of U.S. Pat. No. 8,062,549, the Sr content remained unchanged.

Whereas the modifications to the host in Nagatomi et al.'s case are straightforward, the content changes in U.S. Pat. No. 8,153,025 to Schmidt et al. are less so. This is because the modifications to $SrAlSi_4N_7$ are depicted by two variables varying independently one from the other, as x and y do in $Sr_{1-y}Al_{1+x}Si_{4-x}O_{x+2y}N_{7-(x+2y)}$. The Al and Si analysis is the same as before; as amount of Al is increased ($Al_{1+x}$), the amount of Si is decreased ($Si_{4-x}$). In Schmidt et al., the amount of Sr vary independently from the Al/Si system, so it is given a different variable (y) to describe its decrease in amount ($Sr_{1-y}$) as it contributes to charge balancing. The increase in oxygen and decrease in nitrogen each then depend on both the x and y variables, as denoted by $O_{x+2y}$ and $N_{7-(x+2y)}$, where a factor of 2 is needed to reflect how the valence of Sr affects the charge balance.

The Counter-Intuitive Modifications of the Present Embodiments

In contrast to the methods of Nagatomi et al. and Schmidt et al., the present embodiments employ counter-intuitive approaches to charge balance. Rather than substituting Si with Al by an amount x, according to the present embodiments both Al and Si can be increased independently.

While not wishing to be bound by any particular theory, it is postulated that additional anionic sites for the O/N anions that have been added above the baseline levels in $SrAlSi_4N_7$ may be created by converting corner-shared tetrahedra to isolated or free-standing tetrahedra, and by converting edge-sharing tetrahedra to either corner-shared or free tetrahedra. It will be appreciated how this creates new anionic sites using a simple example: suppose two tetrahedra are corner-sharing tetrahedra, such that the stoichiometric formula of the dimer may be characterized as $Si_2N_7$. The subscript 7 on the N indicates one corner N site is shared between the two tetrahedra. But if the corner sharing tetrahedral dimer separates into two individual $SiN_4$ tetrahedra (designated as $2SiN_4$), then one new corner N site has been "created." Likewise, two tetrahedra with edge-sharing would be represented initially by the formula $Si_2N_6$; after separation, the $2SiN_4$ configuration has in essence created two, new, anionic corner sites.

The net effect of the conversion of edge-sharing tetrahedra to corner-sharing tetrahedra, corner-sharing tetrahedra to isolated tetrahedra, edge-sharing tetrahedra to isolated tetrahedra, etc.; possible insertion of Al/Si between the now more spaced-apart tetrahedra, and even the possible creation of new tetrahedra, would be an expansion of the unit cell. This has indeed been observed experimentally by the present inventors, as shown in Table 1. Table 1 shows that an expansion in the volume of the unit cell, ranging from about 37% to about 44%, was actually observed.

Agreement Between Experiment and Theory with Regard to Composition

It is known in the art that the composition of the sintered phosphor product does not always agree precisely with the composition as it was designed. To state this another way, the composition of the sintered product does not always match what was expected based on the quantities of the weighed starting materials. There can be many reasons for this, but it is interesting to note that similar such difficulties have been reported in the art with the synthesis of modified forms of $Eu:SrAlSi_4N_7$.

One such discussion was given by Ruan et al., in an article titled "Nitrogen gas pressure synthesis and photoluminescent properties of orange-red $SrAlSi_4N_7:Eu^{2+}$ phosphors for white light-emitting diodes," *J. Am. Ceram. Soc.*, 94 [2] 536-542 (2011). Here, Ruan et al. make a critical observation about the synthesis of the $SrAlSi_4N_7$: "the reported synthesis of $SrAlSi_4N_7:Eu^{2+}$ based on radiofrequency furnace is usually baffled by the byproducts of microcrystalline $Sr_2Si_5N_8$." While not wishing to characterize Ruan et al.'s statement, it is certainly understood as the present inventors have experienced similar "difficulties," where the appearance of the red emitting $Sr_2Si_5N_8$ phase interferes with the desired formation of a modified $SrAlSi_4N_7$. It is not believed in the present case that there has been an appearance of undesired phases, particularly $Sr_2Si_5N_8$, when the additional Si exceeds a certain stoichiometric value. While not wishing to be bound by any particular theory, it is believed that the kinetics and/or thermodynamics of the synthesis are such that a $Sr_2Si_5N_8$ phase has, in certain situations, a lower free energy of synthesis than does $SrAlSi_4N_7$, and with this in mind, steps may be taken to modify traditional solid state reaction conditions so as to favor the synthesis of the desired $SrAlSi_4N_7$ compound.

Ruan et al. report that additional AlN may be helpful to solve their problem. They provide x-ray diffraction (XRD) data of samples taken after the first firing, where starting material ratios were calculated based on the desired stoichiometric composition (e.g., $SrAlSi_4N_4$), and after the second firing, where excess AlN has been added. Ruan et al. state their data shows that the primary phase of the product after the first firing was $Sr_2Si_5N_8$, with only a small amount of the desired $SrAlSi_4N_7$ compound being produced. After the second firing, where excess AlN had been added to the mix, the main phase was the desired $SrAlSi_4N_7$ phase, and interestingly, almost no AlN or $Sr_2Si_5N_8$ could be recognized. Whereas it is clear, as the authors state, that the concentration of AlN is critical to the formation of the $SrAlSi_4N_7$ phase, at least under their reaction conditions, the broader point may be made that reaction mechanism(s) leading to the formation of the $SrAlSi_4N_7$ phase are not fully understood.

The phosphors of the present embodiments emit in the green, at about 530 nm, in complete contrast to known $SrAlSi_4N_7$ phosphors, modified or otherwise, which emit in the red. Clearly this makes the present compositions novel. Additionally, the present compositions exhibit expanded unit cells revealed by x-ray diffraction (XRD). This feature might appear to be a logical consequence of a synthesis that involves the addition of Al or Si as well as O but it is not believed to be something a person of ordinary skill in the art could have predicted a priori. In conjunction with the expansion of the unit cell is the appearance of new peaks in the XRD pattern of $SrAlSi_{4.25}O_{0.5}N_7$, that were not present in the unmodified $SrAlSi_4N_7$ control, implying that the phosphors of the present embodiments have a distinctive crystalline structure. The x-ray diffraction patterns of exemplary green nitrides of the present embodiments will be given, along with a discussion of photoluminescent properties that characterize the distinctive green emission of these nitrides.

Photoluminescent Properties and Corresponding X-Ray Diffraction Patterns

Figure 1:
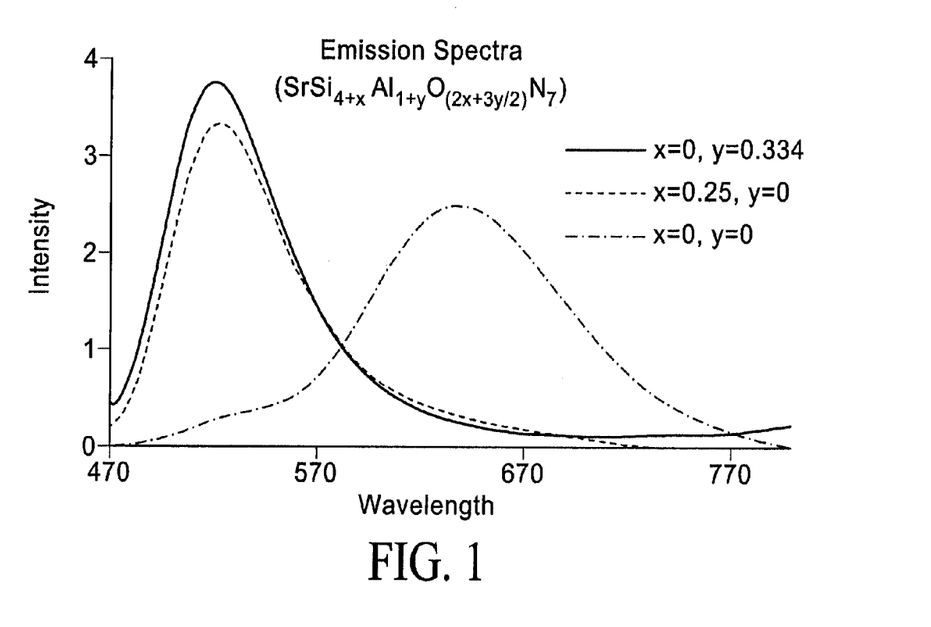
FIG. 1 is a collection of emission spectra for the series having the compositions $SrSi_{4+x}Al_{1+y}O_{(2x+3y/2)}N_7$:Eu, showing that the peak emission wavelength shifts in the green direction with increasing x or y, according to some embodiments of the present invention.

The most surprising aspect occurring during the development of the present green nitrides is depicted in FIG. 1. Here, a series of phosphors was synthesized according to the present embodiments. As shown in FIG. 1, the phosphor for which x=0 and y=0 in $SrSi_{4+x}Al_{1+y}O_{(2x+3y/2)}N_7$:Eu that is to say, the known $SrAlSi_4N_7$ control, emits in the red, at about 640 nm. But then, a completely unexpected result happened: as oxygen was added to synthesize the x=0.25 compound (specifically, the formula would be $SrAlSi_{4.25}O_{0.5}N_7$) the emission shifted to about 520 nm, as shown in FIG. 1, displaying the highest photoluminescence of the series. This compound is considered to be the best performing of the present embodiments, and was used as the test compound in further experiments featured in this disclosure (e.g., comparison to a green emitting β-SiAlON, reliability testing, etc.).

Compositional variations have been investigated, as described below, which provide further insight into the desirable structures and compositions for the green-emitting phosphors. The most critical composition change to the known $SrAlSi_4N_7$ red nitride material is the addition of oxygen.

In one embodiment Si and Al can be increased independently to compensate for the extra charge due to the addition of oxygen, while the nitrogen content is maintained. As discussed above, and see FIG. 1 which is a collection of emission spectra for the series having the compositions $SrSi_{4+x}Al_{1+y}O_{(2x+3y/2)}N_7$:Eu, showing that the peak emission wavelength shifts in the green direction with increasing x or y—that is with increasing O content, charge balanced with Si and/or Al.

In another embodiment, the additional oxygen charge was balanced by a corresponding decrease of the nitrogen charge, while all of the cations (Sr, Si and Al, for example) were maintained with a stoichiometric ratio of $SrAlSi_4$. See FIG. 2 which is a collection of emission spectra for the series having the compositions $SrAlSi_4AlO_xN_{7-2x/3}$:Eu, showing that the peak emission wavelength shifts first in the green direction, and then in the red direction, with increasing x—that is with increasing O to N ratio, such that charge balance is maintained.

Figure 3:
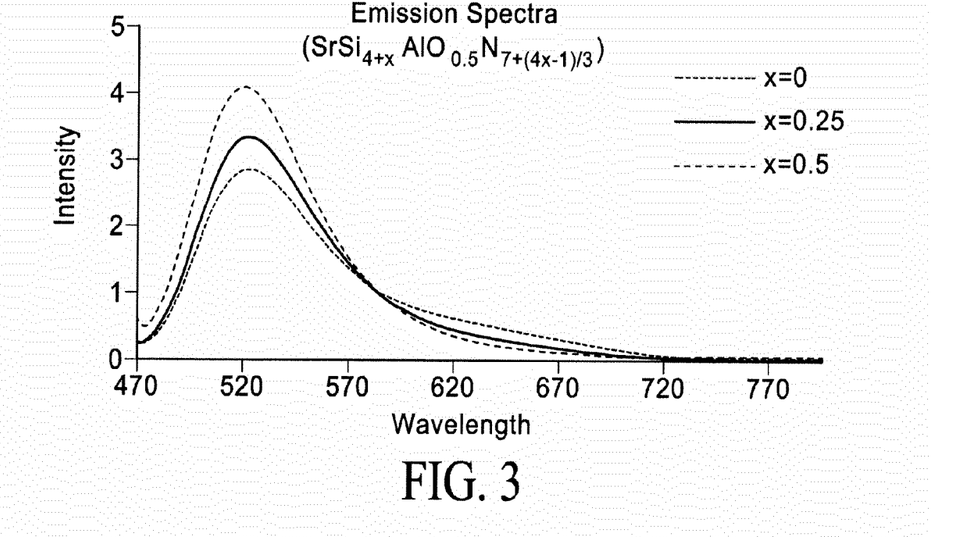
FIG. 3 is a collection of emission spectra for the series having the compositions $SrSi_{4+x}AlO_{0.5}N_{7+(4x-1)/3}$:Eu, showing that the peak emission wavelength shifts in the green direction with increasing x, according to some embodiments of the present invention.

In yet another embodiment, the addition of 0.5 moles of oxygen was charge balanced by both additional silicon and nitrogen. See FIG. 3 which is a collection of emission spectra for the series having the compositions $SrSi_{4+x}AlO_{0.5}N_{7+(4x-1)/3}$:Eu, showing that the peak emission wavelength shifts in the green direction with increasing x—that is with simultaneously increasing both Si and N, while maintaining charge balance.

Figure 4:
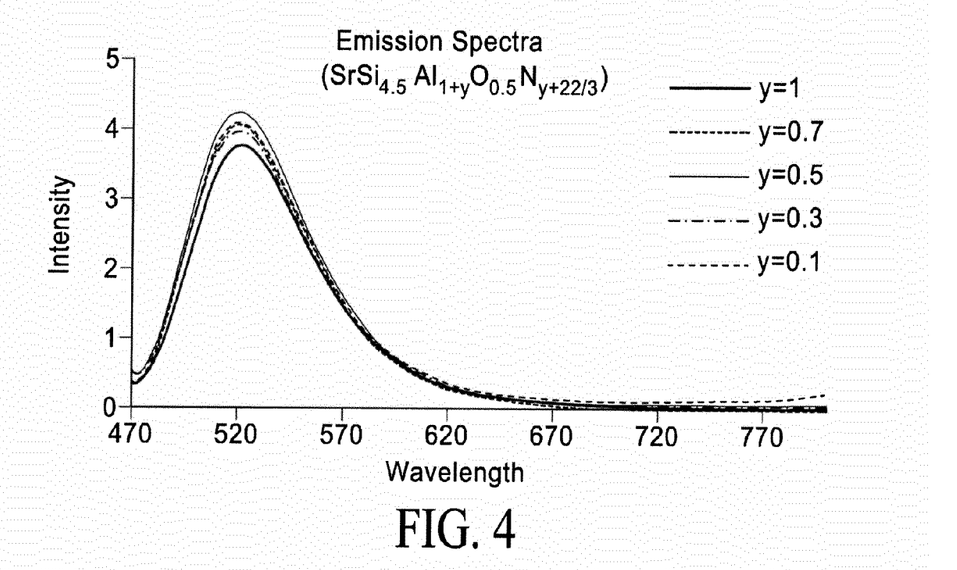
FIG. 4 is a collection of emission spectra for the series having the compositions $SrSi_{4.5}Al_{1+y}O_{0.5}N_{y+22/3}$:Eu, showing that the peak emission wavelength is almost constant with h increasing y, according to some embodiments of the present invention.

In a further embodiment, the addition of 0.5 moles of oxygen was charge balanced by both additional Al and nitrogen. See FIG. 4 which is a collection of emission spectra for the series having the compositions $SrSi_{4.5}Al_{1+y}O_{0.5}N_{y+22/3}$:Eu, showing that the peak emission wavelength is almost constant with increasing y—that is with simultaneously increasing Al and N, while maintaining charge balance.

Figure 5:
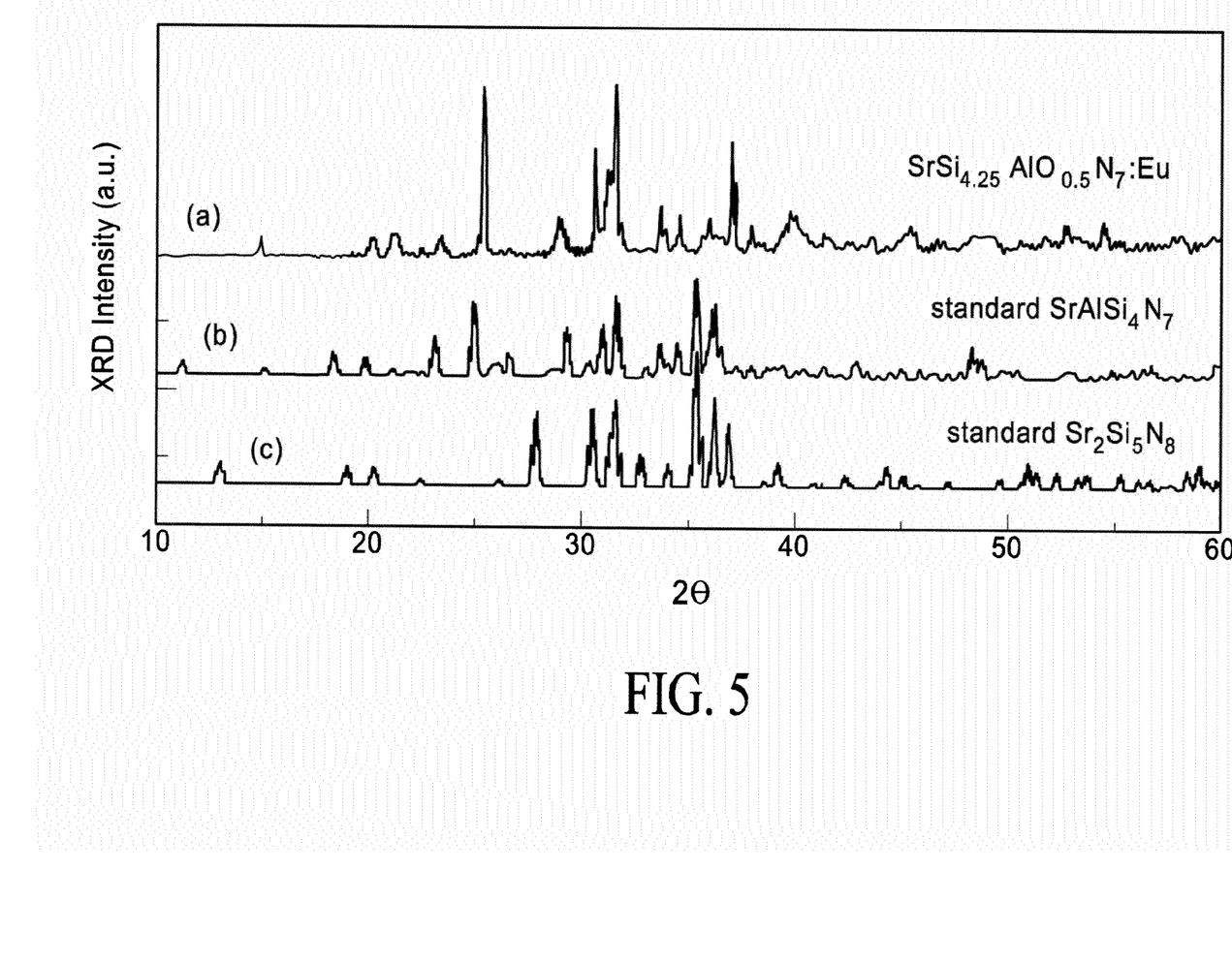
FIG. 5 shows x-ray diffraction patterns of (a) an exemplary composition according to the present invention—$SrSi_{4.25}Al_1O_{0.5}N_7$:Eu, (b) $SrAlSi_4N_7$ and (c) $Sr_2Si_5N_8$, the latter two compounds being known nitride-based phosphors emitting in the orange to red region of the photoluminescent spectrum.

FIG. 5 shows x-ray diffraction patterns of (a) an exemplary composition according to the present invention—$SrSi_{4.25}Al_1O_{0.5}N_7$:Eu, (b) $SrAlSi_4N_7$ and (c) $Sr_2Si_5N_8$, the latter two compounds being known nitride-based phosphors emitting in the orange to red region of the photoluminescent spectrum. (Reference patterns (b) and (c) are from Ruan et al. "Nitrogen gas pressure synthesis and photoluminescent properties of orange-red $SrAlSi_4N_7$:Eu$^{2+}$ phosphors for white light-emitting diodes," *J. Am. Ceram. Soc.*, 94 [2] 536-542 (2011).) Furthermore, FIG. 6 shows (1) an x-ray diffraction pattern of an exemplary composition according to the present invention—$SrSi_{4.25}Al_1O_{0.5}N_7$:Eu—and (2) a simulated x-ray diffraction pattern of $SrAlSi_4N_7$—a known nitride-based phosphor emitting in the orange to red region of the photoluminescent spectrum, with x=0 in the nomenclature of the present green nitride phosphors.

Figure 6:
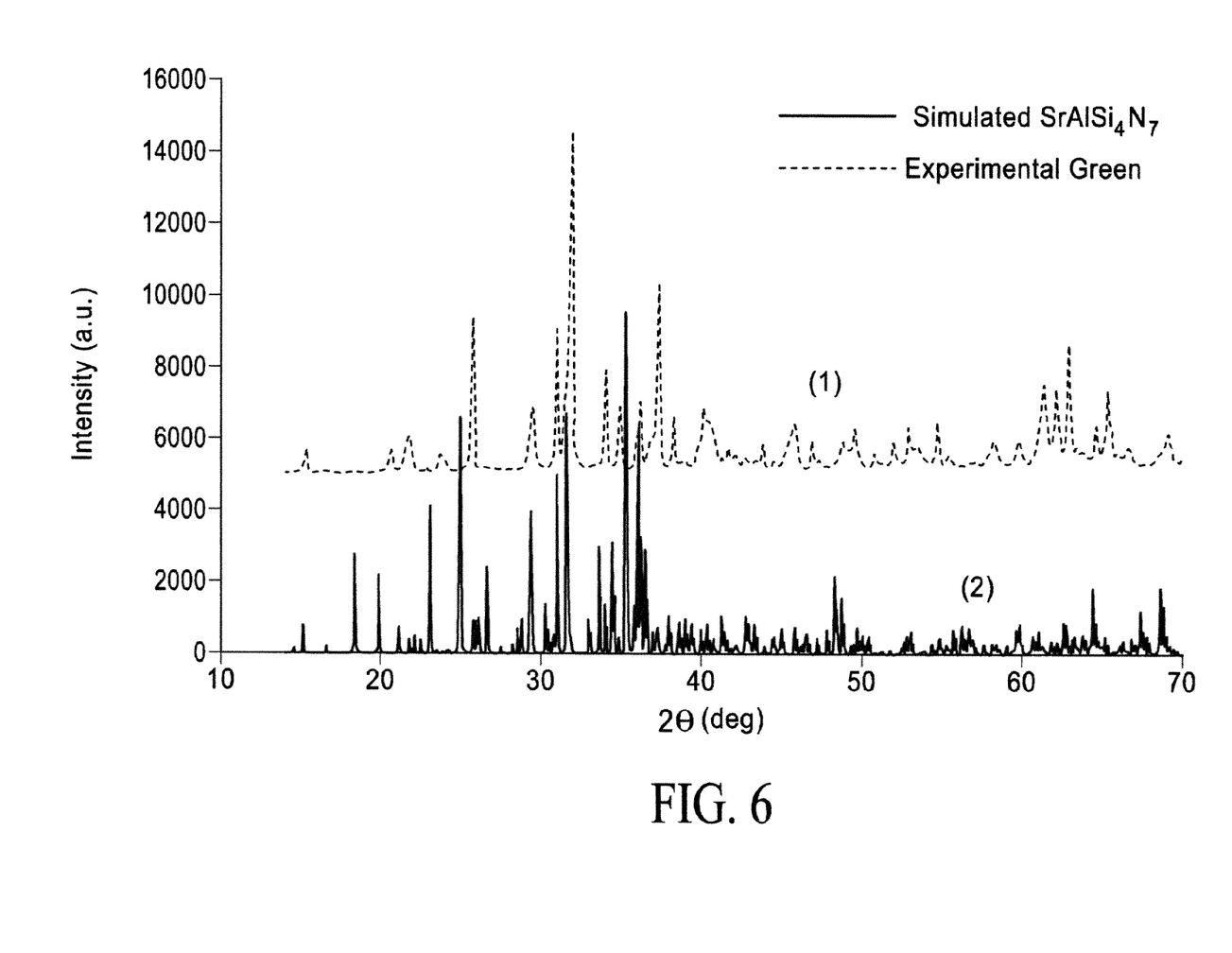
FIG. 6 shows (1) x-ray diffraction pattern of an exemplary composition according to the present invention—$SrSi_{4.25}Al_1O_{0.5}N_7$:Eu—and (2) simulated x-ray diffraction pattern of $SrAlSi_4N_7$—a known nitride-based phosphor emitting in the orange to red region of the photoluminescent spectrum.

Referring to FIGS. 5 and 6, two notable differences in the XRD patterns of $SrAlSi_4N_7$ and $SrSi_{4.25}AlO_{0.5}N_7$:Eu are a shift in 2θ of a peak at about 25 degrees (these two peaks have two different intensities as well), and peaks at about 37, 62, 63 and 64 degrees that are present in the green-emitting $SrSi_{4.25}AlO_{0.5}N_7$:Eu phosphor, but not the red-emitting $SrAlSi_4N_7$ control. Furthermore, the absence of any $Sr_2Si_5N_8$ in the $SrSi_{4.25}AlO_{0.5}N_7$:Eu is apparent from the XRD spectra.

These are not single-crystal x-ray diffraction patterns, so it is difficult to make definitive conclusions, but certain points may be made. The identity of the crystallographic planes causing the reflections at 37, 62, 63, and 64 degrees is not known. It is of course known that the positions of peaks in 2θ space determine the size and shape of the unit cell (and therefore the crystal system), and the peak intensities indicate atomic positions, but the significance of the difference between the peaks in the patterns is not known. The peak at about 37 degrees that is present in the green-emitting $SrAlSi_{4.25}O_{0.5}N_7$ phosphor, and absent in the red-emitting $SrAlSi_4N_7$:Eu control, may have something to do with the additional Al, Si, O, and N atoms, perhaps located in additional tetrahedra, on new planes.

TABLE 1

|  | Hecht et al., Chem. Mater. 2009, 21, 1595-1601 | Refinement #1 of the present embodiments | Refinement #2 of the present embodiments |
|---|---|---|---|
| Bravais lattice | Primitive Orthorhombic | Primitive Orthorhombic | Primitive Orthorhombic |
| Space group | Pna2$_1$ (No. 33) | unknown | unknown |
| Unit cell a parameter | a = 11.7 Å | a = 24.8 Å | a = 17.5 Å |
| Unit cell b parameter | b = 21.4 Å | b = 17.3 Å | b = 16.7 Å |
| Unit cell c parameter | c = 4.95 Å | c = 3.93 Å | c = 6.11 Å |
| Volume of the unit cell | V = 1239.4 Å$^3$ | V = 1691.9 Å$^3$ | V = 1788.8 Å$^3$ |

Some crystallographic properties of an exemplary phosphor of the present invention - $SrAlSi_{4.25}O_{0.5}N_7$ - compared to prior art $SrAl_{1+x}Si_{4-x}O_xN_{7-x}$, (Hecht et al.).

Table 1 summarizes some of the crystallographic properties that are known about the present green-emitting (oxy) nitrides. Although the space group of the $SrAlSi_{4.25}O_{0.5}N_7$ phosphor is not known, it is known that the crystal system is primitive orthorhombic. The data was fit to two different refinements, and both seemed to be equally appropriate. Whichever refinement is the more accurate, the important point is that the volumes of the unit cell were found to be 1691.9 Å$^3$, and 1788.8 Å$^3$, respectively, which is a significantly larger volume than the volume of the control $SrAlSi_4N_7$ unit cell, which was 1239.4 Å$^3$. As noted earlier, the significance of this volume data is that it supports the notion that the added Al, Si, O, and N atoms are going somewhere in the crystalline host, and this logically would lead to an expansion of the unit cell.

The novel features of the present green-emitting (oxy) nitride phosphors have been discussed. In the final portion of this disclosure a few remaining topics will be addressed, including 1) the emission of the present green-emitting, (oxy) nitride phosphors based on $SrAlSi_4N_7$ will be compared to the prior art green-emitting β-SiAlON, 2) SEM photographs are shown, 3) reliability testing is discussed, and, finally 4) the performance of the present green-emitting (oxy)nitride as part of a white LED will be reviewed.

Comparison of Green-Emitting Phosphors; the Present Phosphor Vs. a β-SiAlON

It was mentioned earlier that nitride-based phosphors derived from the alpha form of silicon nitride, denoted α-$Si_3N_4$, preserve the orientation of the stacking of the layers of silicon and nitrogen containing rings. The present green-emitting phosphors are believed to have an alpha stacking of layers. A phosphor known in the art, however, that also emits in the green has the beta form, and it may be designated by the representation β-SiAlON. The stoichiometries of the Si, Al, O, and N constituents of the β-SiAlON are not shown in representations of the compound.

Figure 7:
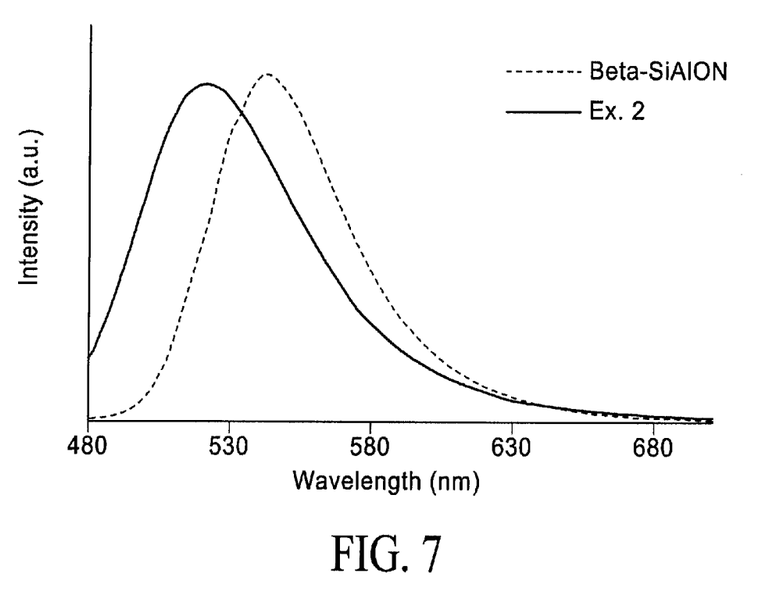
FIG. 7 is the emission spectra of the phosphor of Example 1 (solid line), plotted together with the emission spectra from a commercially available β-SiAlON phosphor (dashed line)

FIG. 7 is an emission spectra of the phosphor of Example 1 (solid line), where the value of the x parameter is 0.3, plotted together with the emission spectra from a commercially available β-SiAlON phosphor (dashed line). The x=0.3 embodiment of the present green nitride has the formula $Sr_{0.7}Al_{1.3}Sr_{4.3}O_{0.3}N_{7.3}$.

Although the $Sr_{0.7}Al_{1.3}Sr_{4.3}O_{0.3}N_{7.3}$ phosphor does not have quite the intensity of the commercially available β-SiAlON phosphor, the peak emission wavelength of the novel phosphor is at least about 30 nm shorter than the β-SiAlON, which has advantages in many applications, including usage in a white LED.

SEM Images

Figure 8A:
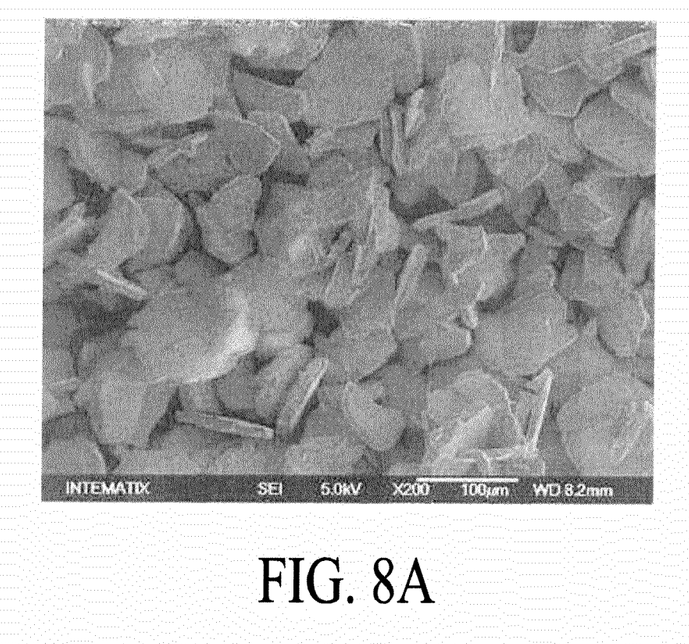
FIGS. 8A and 8B are two representative SEM micrographs of the green-emitting phosphor of the present invention.
Figure 8B:
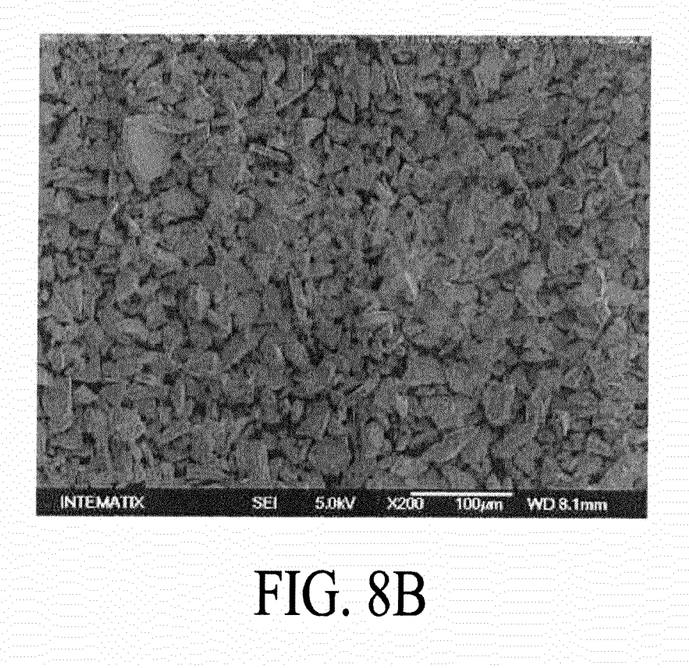

FIGS. 8 A & B are two scanning electron micrographs (SEM) which are representative of the green-emitting phosphor of the present invention. The morphology of the crystalline particles appears to be, at least in part, plate-like.

Reliability Testing

Figure 9A:
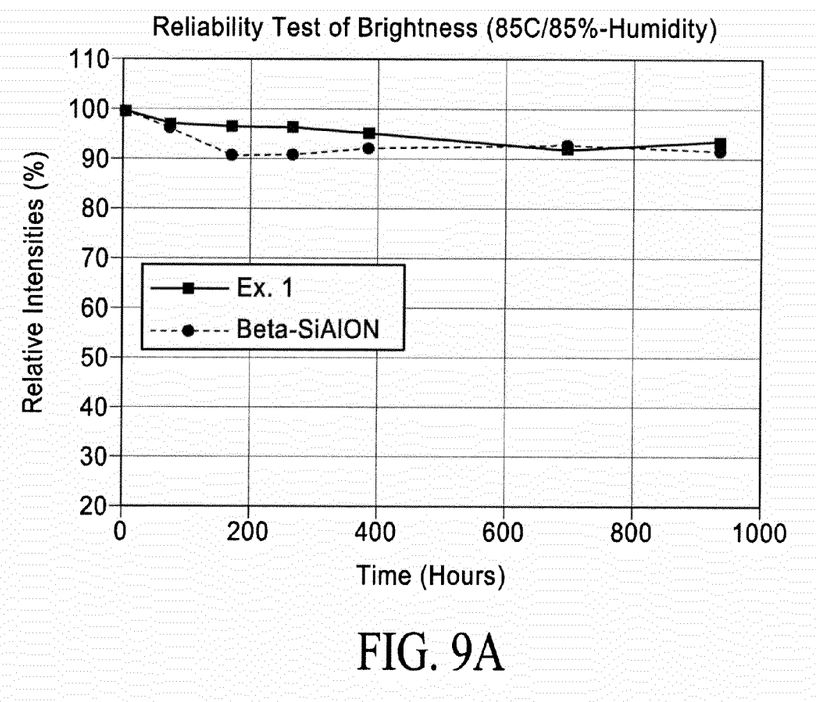
FIG. 9A is the change in photoluminescent intensity (brightness) with time.
Figure 9B:
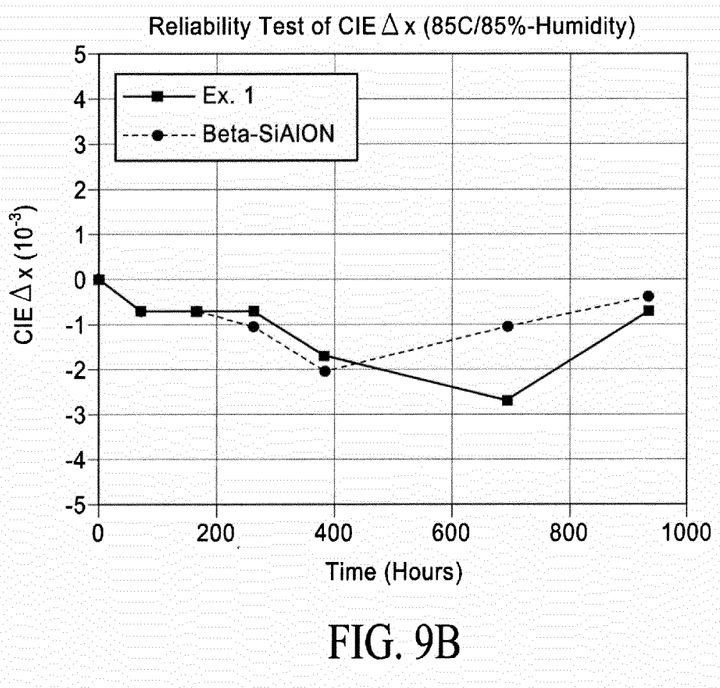
FIG. 9B is the change in the chromaticity coordinate CIE Δx with time.
Figure 9C:
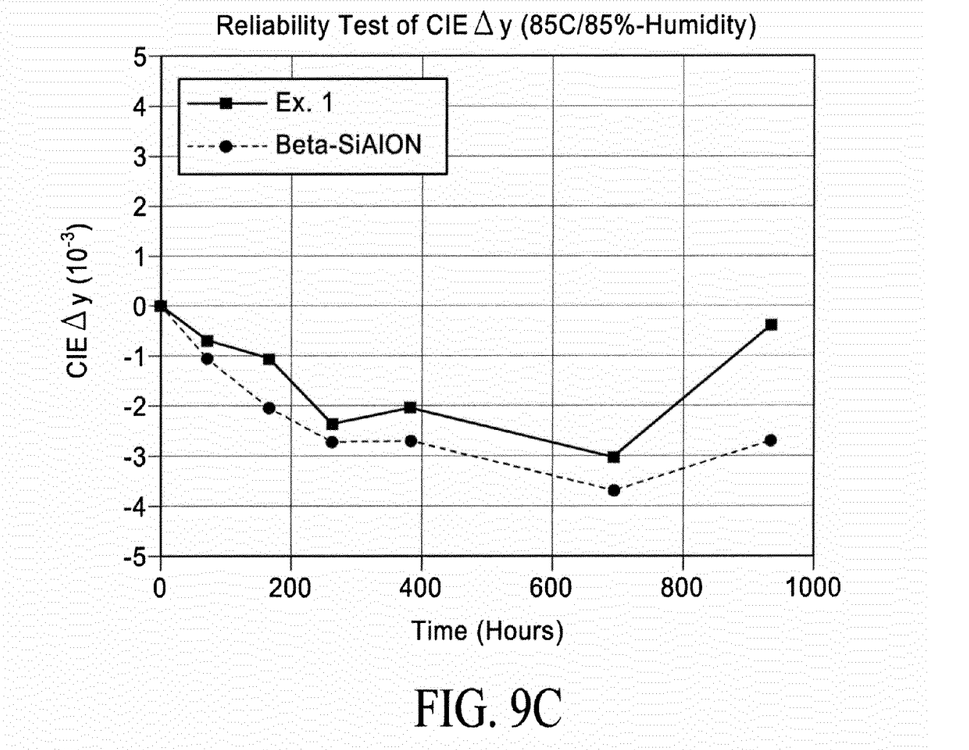
FIG. 9C is the change in the chromaticity coordinate CIE Δy with time.

FIGS. 9A-9C are the results of reliability testing under the conditions for 1,000 hours of 85° C. and 85% humidity for the phosphor of Example 1, compared to the commercially available β-SiAlON phosphor; FIG. 9A is the change in photoluminescent intensity (brightness) with time; FIG. 9B is the change in the chromaticity coordinate CIE Δx with time; and FIG. 9C is the change in the chromaticity coordinate CIE Δy with time.

From a brightness point of view, the results show (FIG. 9A) that the present phosphor $SrAlSr_{4.25}O_{0.5}N_7$, has an enhanced stability compared to a commercially available β-SiAlON phosphor within the region starting at about 100 hours into the test to about 600 hours. At its greatest, the present phosphor $SrAlSr_{4.25}O_{0.5}N_7$ is greater than the commercially available β-SiAlON phosphor by at least about 15 percent.

While the present phosphor $SrAlSr_{4.25}O_{0.5}N_7$ may have experienced a greater change in the chromaticity value CIE Δx from about 400 hours to about 900 hours (see FIG. 9B), the present phosphor $SrAlSr_{4.25}O_{0.5}N_7$ demonstrated substantially greater stability in the chromaticity value CIE Δy over the entire length of the test (from 0 to about 950 hours).

The inclusion of oxygen in these green-emitting (oxy)nitride phosphors does not appear to have a deleterious effect on stability.

The Present Phosphors as Part of a White LED

Figure 10:
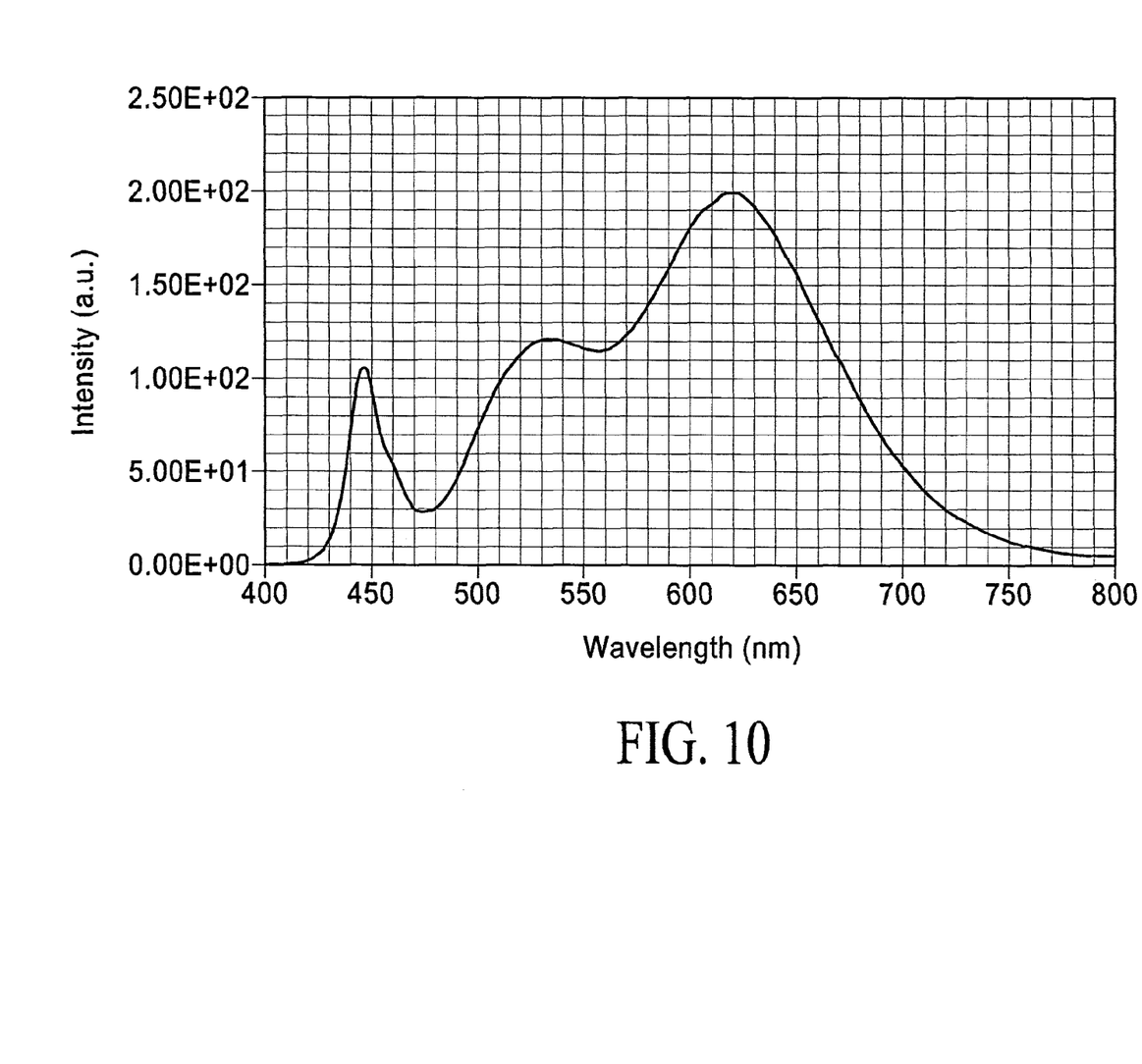
FIG. 10 is the emission spectra of a white light source (3000 K) based on a phosphor-converted (PC) LED; the excitation source comprised an InGaN chip that provided blue light to the white light product in addition to its excitation role; the phosphor $(Ca_{0.2}Sr_{0.8})AlSiN_3$:$Eu^{2+}$ contributed red light; the present phosphor from Example 1 contributed green light.

FIG. 10 is the emission spectra of a white light source (3000 K) based on a phosphor-converted (PC) LED; the excitation source comprised an InGaN chip that provided blue light to the white light product in addition to its excitation role; the phosphor $(Ca_{0.2}Sr_{0.8})AlSiN_3:Eu^{2+}$ contributed red light; the present phosphor from Example 1 $(SrAlSr_{4.25}O_{0.5}N_7)$ contributed green light. Other embodiments of the green-emitting oxynitride phosphor of the present invention may be used in place of the Example 1 phosphor to form the phosphor-converted LED as described above.

EXAMPLES

The following examples of the synthesis of the present green-emitting, (oxy)nitride-based phosphors provide further information that one of ordinary skill in the art may implement to make or use the present embodiments. For all examples 1 to 13 and comparative examples described herein, the starting raw materials were selected from at least one of $Si_3N_4$, AlN, $Al_2O_3$, $Ca_3N_2$, $Sr_3N_2$, and $EuCl_3$.

First, to obtain a compound represented by a composition having the formula represented generally by $(Eu,Sr)Si_{4+x}Al_{1+y}O_{(2x+3y/2)}N_7$, where x ranges from greater than zero to less than or equal to 1, y ranges from greater than zero to less than or equal to 0.5. Ex. 1 and Ex. 2 (FIG. 1) are for x=0/y=0.334 and x=0.25/y=0 respectively.

Figure 2:
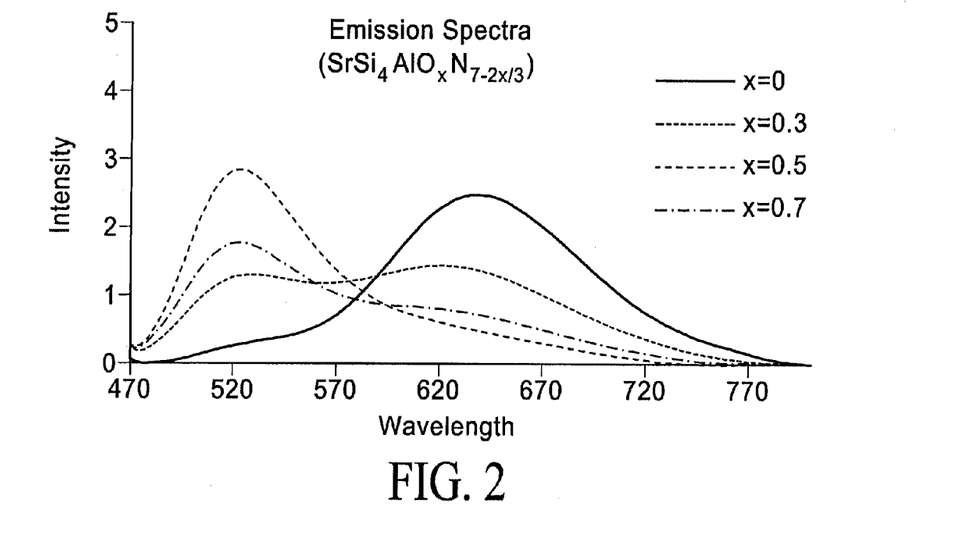
FIG. 2 is a collection of emission spectra for the series having the compositions $SrSi_4AlO_xN_{7-2x/3}$:Eu, showing that the peak emission wavelength shifts first in the green direction, and then in the red direction, with increasing x value, according to some embodiments of the present invention.

Then to obtain a compound represented by a composition having the formula represented generally by $(Eu,Sr)Si_4AlO_xN_{7-2x/3}$, where x ranges from greater than zero to less than or equal to 1 for Ex. 3-5 (FIG. 2).

To further obtain a compound represented by a composition having the formula represented generally by $(Eu,Sr)Si_{4+x}AlO_{0.5}N_{7+(4x-1)/3}$, where x ranges from greater than zero to less than or equal to 3 for Ex. 6-8 (FIG. 3), and by $(Eu,Sr)Si_{4.5}Al_{1+y}O_{0.5}N_{y+22/3}$, where y ranges from greater than zero to less than or equal to 2 for Ex. 9-13 (FIG. 4), respectively.

The starting raw materials for Ex. 1-13 were weighed according to the designed compositions, respectively. The weighed raw materials were then loaded into a plastic milling bottle for mixing well. The mixed powders were then loaded into a crucible. The loaded crucibles were placed into a high temperature nitrogen furnace.

After placing the mixed raw material powders in the furnace, the furnace was then pumped down to a pressure of about $10^{-2}$ Pa, and a heating ramp applied to bring the raw material mixture to an intermediate temperature of about 150° C. (still under vacuum). At 150° C., high purity $N_2$ gas was introduced into the chamber. The chamber was then heated to 1700° C. at a constant heating rate of about 4° C./min. The samples were sintered at this temperature for about 5 to 10 hours.

After sintering, the power was shut off to the furnace, and the samples allowed to cool to room temperature as they remained in the furnace. The as-sintered phosphor was ground slightly, then ground and ball milled to a certain particle size. This was followed by a wash, dry, and sieve procedure to isolate a range of desired particle size(s). The final phosphor product was tested using an Ocean Optics USB4000 spectrometer for photoluminescence intensity (PL), and CIE chromaticity. The testing results for Ex. 1-13 are listed in Table 2.

TABLE 2

| | Peak Emission Wavelength (nm) | Relative Intensity | CIE X | CIE Y |
|---|---|---|---|---|
| Ex.1 (x = 0, y = 0.334) | 521 | 1.38 | 0.263 | 0.607 |
| Ex.2 (x = 0.25, y = 0) | 523 | 1.17 | 0.286 | 0.601 |
| Ex.3 (x = 0.3) | 521 | 0.53 | 0.426 | 0.514 |
| Ex.4 (x = 0.5) | 524 | 1.00 | 0.310 | 0.592 |
| Ex.5 (x = 0.7) | 524 | 0.62 | 0.301 | 0.592 |
| Ex.6 (x = 0) | 524 | 1.00 | 0.310 | 0.592 |
| Ex.7 (x = 0.25) | 523 | 1.17 | 0.286 | 0.601 |
| Ex.8 (x = 0.5) | 521 | 1.46 | 0.266 | 0.609 |
| Ex.9 (y = 0.1) | 521 | 1.48 | 0.263 | 0.607 |
| Ex.10 (y = 0.3) | 520 | 1.44 | 0.261 | 0.608 |
| Ex.11 (y = 0.5) | 521 | 1.53 | 0.261 | 0.609 |
| Ex.12 (y = 0.7) | 521 | 1.51 | 0.259 | 0.615 |
| Ex.13 (y = 1) | 522 | 1.39 | 0.267 | 0.612 |

$(Eu,Sr)Si_{4+x}Al_{1+y}O_{(2x+3y/2)}N_7$, Ex. 1-2;
$(Eu,Sr)Si_4AlO_xN_{7-2x/3}$, Ex. 3-5;
$(Eu,Sr)Si_{4+x}AlO_{0.5}N_{7+(4x-1)/3}$, Ex. 6-8; and
$(Eu,Sr)Si_{4.5}Al_{1+y}O_{0.5}N_{y+22/3}$, Ex. 9-13.

X-ray diffraction patterns of each of the phosphor samples were taken using the powder x-ray diffraction technique using the $K_\alpha$ line of a Cu target. X-ray diffraction (XRD) patterns of all green emitting composition samples from Ex.

1 to Ex. 13 are the same and an exemplary composition $SrSi_{4.25}AlO_{0.5}N_7$:Eu is shown in FIGS. 5 & 6.

Although the present invention has been particularly described with reference to certain embodiments thereof, it should be readily apparent to those of ordinary skill in the art that changes and modifications in the form and details may be made without departing from the spirit and scope of the invention.

What is claimed is:

1. A green-emitting oxynitride phosphor having the formula $Eu^{2+}$:$M^{2+}Si_4AlO_xN_{7-2x/3}$, wherein:
   x ranges from greater than or equal to 0.1 to less than or equal to 1.0; and
   $M^{2+}$ represents one or more different divalent metals selected from the group consisting of Mg, Ca, Sr, Ba, and Zn;
   wherein the green-emitting oxynitride phosphor is configured to emit light having a peak emission wavelength ranging from about 500 nm to about 550 nm under excitation of blue light ranging from about 420 nm to about 470 nm.

2. The green-emitting oxynitride phosphor of claim 1, wherein $M^{2+}$ is Sr.

3. The green-emitting oxynitride phosphor of claim 2, wherein the phosphor is $Eu$:$SrAlSi_4O_{0.5}N_{20/3}$.

4. The green-emitting oxynitride phosphor of claim 1, wherein x is chosen to shift the peak emission intensity to a shorter wavelength by at least 100 nm from the peak emission intensity at x=0.

5. A green-emitting oxynitride phosphor having the formula $Eu^{2+}$:$M^{2+}Si_{4.5}Al_{1+y}O_{0.5}N_{y+22/3}$, wherein:
   y ranges from greater than or equal to 0.3 to less than or equal to 1.0; and
   $M^{2+}$ represents one or more different divalent metals selected from the group consisting of Mg, Ca, Sr, Ba, and Zn;
   wherein the green-emitting oxynitride phosphor is configured to emit light having a peak emission wavelength ranging from about 500 nm to about 550 nm under excitation of blue light ranging from about 420 nm to about 470 nm.

6. The green-emitting oxynitride phosphor of claim 5, wherein $M^{2+}$ is Sr.

7. The green-emitting oxynitride phosphor of claim 6, wherein the phosphor is $Eu$:$SrAl_2Si_{4.5}O_{0.5}N_{25/3}$.

8. A white light illumination system comprising:
   an excitation source with emission wavelength within a range of 200 nm to 480 nm;
   a red phosphor with emission wavelength range of 600 nm to 670 nm; and
   a green-emitting oxynitride phosphor having the formula $Eu^{2+}$:$M^{2+}Si_4AlO_xN_{7-2x/3}$, wherein:
      x ranges from greater than or equal to 0.1 to less than or equal to 1.0; and
      $M^{2+}$ represents one or more different divalent metals selected from the group consisting of Mg, Ca, Sr, Ba, and Zn;
      wherein the green-emitting oxynitride phosphor is configured to emit light having a peak emission wavelength ranging from about 510 nm to about 540 nm.

9. The white light illumination system of claim 8, wherein the red phosphor is at least one of the phosphors selected from the group $(Sr,Ca)AlSiN_3$:$Eu^{2+}$ and $(Sr,Ca)_2Si_5N_8$:$Eu^{2+}$.

10. The white light illumination system of claim 8, wherein $M^{2+}$ is Sr.

11. The white light illumination system of claim 10, wherein the green-emitting oxynitride phosphor is $Eu$:$SrAlSi_4O_{0.3}N_{6.8}$.

12. The white light illumination system of claim 10, wherein the green-emitting oxynitride phosphor is $Eu$:$SrAlSi_4O_{0.5}N_{20/3}$.

13. The white light illumination system of claim 10, wherein the green-emitting oxynitride phosphor is $Eu$:$SrAlSi_4O_{0.7}N_{19.6/3}$.

14. The white light illumination system of claim 8, wherein the green-emitting oxynitride phosphor is characterized by an x-ray diffraction pattern comprising major diffraction peaks at 2θ values of about 25, 31, 32, 37, 62, 63, and 64 degrees.

15. The green-emitting oxynitride phosphor of claim 2, wherein the phosphor is $Eu$:$SrAlSi_4O_{0.3}N_{6.8}$.

16. The green-emitting oxynitride phosphor of claim 2, wherein the phosphor is $Eu$:$SrAlSi_4O_{0.7}N_{19.6/3}$.

17. The green-emitting oxynitride phosphor of claim 1, wherein the phosphor is characterized by an x-ray diffraction pattern comprising major diffraction peaks at 2θ values of about 25, 31, 32, 37, 62, 63, and 64 degrees.

18. The green-emitting oxynitride phosphor of claim 6, wherein the phosphor is $Eu$:$SrAl_{1.3}Si_{4.5}O_{0.5}N_{22.9/3}$.

19. The green-emitting oxynitride phosphor of claim 6, wherein the phosphor is $Eu$:$SrAl_{1.5}Si_{4.5}O_{0.5}N_{23.5/3}$.

20. The green-emitting oxynitride phosphor of claim 6, wherein the phosphor is $Eu$:$SrAl_{1.7}Si_{4.5}O_{0.5}N_{24.1/3}$.

21. The green-emitting oxynitride phosphor of claim 5, wherein the phosphor is characterized by an x-ray diffraction pattern comprising major diffraction peaks at 2θ values of about 25, 31, 32, 37, 62, 63, and 64 degrees.

22. A white light illumination system comprising:
   an excitation source with emission wavelength within a range of 200 nm to 480 nm;
   a red phosphor with emission wavelength range of 600 nm to 670 nm; and
   a green-emitting oxynitride phosphor having the formula $Eu^{2+}$:$M^{2+}Si_{4.5}Al_{1+y}O_{0.5}N_{y+22/3}$, wherein:
      y ranges from greater than or equal to 0.3 to less than or equal to 1.0; and
      $M^{2+}$ represents one or more different divalent metals selected from the group consisting of Mg, Ca, Sr, Ba, and Zn;
      wherein the green-emitting oxynitride phosphor is configured to emit light having a peak emission wavelength ranging from about 510 nm to about 540 nm.

23. The white light illumination system of claim 22, wherein the red phosphor is at least one of the phosphors selected from the group $(Sr,Ca)AlSiN_3$:$Eu^{2+}$ and $(Sr,Ca)_2Si_5N_8$:$Eu^{2+}$.

24. The white light illumination system of claim 22, wherein $M^{2+}$ is Sr.

25. The white light illumination system of claim 22, wherein the green-emitting oxynitride phosphor is $Eu$:$SrAl_{1.3}Si_{4.5}O_{0.5}N_{22.9/3}$.

26. The white light illumination system of claim 22, wherein the green-emitting oxynitride phosphor is $Eu$:$SrAl_{1.5}Si_{4.5}O_{0.5}N_{23.5/3}$.

27. The white light illumination system of claim 22, wherein the green-emitting oxynitride phosphor is $Eu$:$SrAl_{1.7}Si_{4.5}O_{0.5}N_{24.1/3}$.

28. The white light illumination system of claim 22, wherein the green-emitting oxynitride phosphor is $Eu$:$SrAl_2Si_{4.5}O_{0.5}N_{25/3}$.

29. The white light illumination system of claim 22, wherein the green-emitting oxynitride phosphor is characterized by an x-ray diffraction pattern comprising major diffraction peaks at 2θ values of about 25, 31, 32, 37, 62, 63, and 64 degrees.

* * * * *